(12) United States Patent
Park

(10) Patent No.: US 10,134,777 B2
(45) Date of Patent: Nov. 20, 2018

(54) THIN FILM TRANSISTOR SUBSTRATE AND DISPLAY DEVICE INCLUDING THE SAME

(71) Applicant: LG Display Co., Ltd., Seoul (KR)

(72) Inventor: JeHyung Park, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/364,218

(22) Filed: Nov. 29, 2016

(65) Prior Publication Data

US 2018/0076233 A1  Mar. 15, 2018

(30) Foreign Application Priority Data

Sep. 13, 2016 (KR) .................... 10-2016-0118180

(51) Int. Cl.
| | |
|---|---|
| *H01L 29/49* | (2006.01) |
| *H01L 27/12* | (2006.01) |
| *H01L 23/544* | (2006.01) |
| *H01L 29/417* | (2006.01) |
| *H01L 29/423* | (2006.01) |

(52) U.S. Cl.
CPC ........ *H01L 27/1244* (2013.01); *H01L 23/544* (2013.01); *H01L 29/41733* (2013.01); *H01L 29/41775* (2013.01); *H01L 29/42384* (2013.01); *H01L 2223/54406* (2013.01)

(58) Field of Classification Search
CPC ............... H01L 27/1244; H01L 23/544; H01L 29/41775
See application file for complete search history.

(56) References Cited

U.S. PATENT DOCUMENTS

| | | | |
|---|---|---|---|
| 2001/0028417 A1 | 10/2001 | Ozaki et al. | |
| 2001/0028418 A1 | 10/2001 | Ozaki et al. | |
| 2008/0165110 A1 | 7/2008 | Kim et al. | |
| 2015/0331270 A1 | 11/2015 | Yokogawa | |

FOREIGN PATENT DOCUMENTS

| | | |
|---|---|---|
| WO | WO2010032386 | 3/2010 |
| WO | WO2011104945 | 9/2011 |
| WO | WO2014054483 | 4/2014 |

*Primary Examiner* — Michael Shingleton
(74) *Attorney, Agent, or Firm* — Fenwick & West LLP

(57) ABSTRACT

Disclosed is a thin film transistor substrate capable of preventing a circuit from being damaged by static electricity, and a display device including the same, wherein the thin film transistor substrate includes a substrate having a display area for displaying an image, and a non-display area. The circuit is disposed in the non-display area. The circuit includes a first electrode, an insulating film on the first electrode, and a second electrode on the insulating film. An edge of the first electrode facing the display area extends beyond an edge of the second electrode facing the display area.

23 Claims, 6 Drawing Sheets

THIN FILM TRANSISTOR SUBSTRATE AND DISPLAY DEVICE INCLUDING THE SAME

CROSS REFERENCE TO RELATED APPLICATION

This application claims the benefit of Republic of Korea Patent Application No. 10-2016-0118180 filed on Sep. 13, 2016, which is hereby incorporated by reference as if fully set forth herein.

BACKGROUND

Field of the Disclosure

Embodiments of the present invention relate to a thin film transistor substrate, and a display device including the same.

Discussion of the Related Art

With the advancement of an information-oriented society, various technologies related with a display device for displaying image or picture of visual information have been developed and studied. The display device may include a display panel having a display area provided with pixels for displaying an image, and a non-display area prepared in the periphery of the display area, a gate driver for supplying a gate signal to the pixels, a data driver for supplying a data voltage to the pixels, and a timing controller for supplying signals to control the gate driver and the data driver.

The gate driver may be provided at one side or two sides on the non-display area. In this case, instead of providing the gate driver which is manufactured in an additional integrated circuit type, and connected with the pixels through the use of flexible films, the gate driver together with a TFT (thin film transistor) of the pixel may be directly formed in the non-display area of the display panel, and connected with the pixel, which is referred to as a GIP (Gate In Panel) circuit.

The GIP circuit may be formed of a shift register circuit including a plurality of transistors with a gate pattern, a gate insulator, and a source/drain pattern on a lower substrate. The GIP circuit is connected with a gate line prepared in the display area through a gate connection pattern. The gate connection pattern is formed to have a relatively large area at an end of the gate line being adjacent to the GIP circuit, and is connected with the transistor of the GIP circuit through a bridge pattern. Accordingly, the gate signal generated in the GIP circuit is supplied to the gate line via the bridge pattern and the gate connection pattern. The gate pattern and the gate connection pattern are covered by a gate insulating film.

During manufacturing process of the thin film transistor substrate, a robot arm for loading or unloading a substrate may induce static electricity on the substrate. This static electricity is discharged to the GIP circuit at an end of the gate connection pattern via the gate connection pattern with the relatively large area along the gate line, whereby some of the gate insulating film for covering the gate pattern of the GIP circuit adjacent to the gate connection pattern may be damaged and lost. Through the lost area of the gate insulating film, the gate connection pattern is exposed, and then the exposed portion of the gate connection pattern is electrically connected with the source/drain pattern provided on the gate insulating film, thereby causing a short defect.

SUMMARY

Accordingly, embodiments disclosed herein are directed to a thin film transistor substrate that substantially obviates one or more problems due to limitations and disadvantages of the related art, and a display device including the same.

In one or more embodiments, a thin film transistor substrate capable of preventing a circuit part from being damaged by static electricity, and a display device including the same are disclosed.

Additional advantages and features of embodiments will be set forth in part in the description which follows and in part will become apparent to those having ordinary skill in the art upon examination of the following or may be learned from practice of embodiments. The objectives and other advantages of embodiments may be realized and attained by the structure particularly pointed out in the written description and claims hereof as well as the appended drawings.

In one or more embodiments, a thin film transistor substrate includes a substrate having a display area for displaying an image, and a non-display area adjacent to the display area, and a circuit part in the non-display area, the circuit part including a first electrode, an insulating film on the first electrode, and a second electrode on the insulating film. The first electrode and the second electrode may partially overlap with each other. An edge of the first electrode facing the display area may extend beyond an edge of the second electrode facing the display area.

In one or more embodiments, the circuit part may include a transistor, the first electrode may be a gate electrode of the transistor, and the second electrode may be a drain electrode or a source electrode of the transistor.

The thin film transistor substrate according to one embodiment may further include a barrier pattern disposed between the first electrode and a gate connection pattern.

In one or more embodiments, a display device includes a display panel including a thin film transistor substrate and an opposite substrate facing the thin film transistor substrate for protecting the thin film transistor substrate, and a panel driver electrically connected to a circuit part of the thin film transistor substrate for displaying an image.

In one or more embodiments, a thin film transistor substrate comprises a substrate having a display area for displaying an image, and a non-display area adjacent to the display area, and a circuit in the non-display area. The circuit includes a first electrode, a second electrode partially overlapping with the first electrode, and an insulating layer disposed between the first electrode and the second electrode. A first edge of the first electrode that faces the display area extends further towards the display area than a second edge of the second electrode that faces the display area by at least a length of an exposed portion of the first electrode at the first edge not covered by the insulating layer between the second edge of the second electrode and the display area.

In one or more embodiments, the first edge of the first electrode protrudes further than the second edge of the second electrode towards the display area by at least 3 μm.

In one or more embodiments, the circuit includes a transistor. The first electrode may be a gate electrode of the transistor, and the second electrode may be a drain electrode of the transistor.

In one or more embodiments, the circuit further includes a bridge pattern coupled to the second electrode. The bridge pattern may be partially overlapped with an extending portion of the first electrode, where the extending portion of the first electrode is disposed between the first edge of the first electrode and the second edge of the second electrode.

In one or more embodiments, the thin film transistor substrate further includes a gate connection pattern electrically connected to the bridge pattern, where the gate connection pattern is disposed on a same layer as the first electrode. The gate connection pattern may be coupled to a gate line extending over the display area.

In one or more embodiments, the thin film transistor substrate further includes, a static induction pattern disposed on one of the first edge of the first electrode and a third edge of the gate connection pattern facing the first electrode. The static induction pattern may include a protruding tip. The protruding tip may not overlap with the bridge pattern.

In one or more embodiments, the circuit is a gate driving circuit.

In one or more embodiments, the exposed portion of the first electrode is exposed through a removed portion of the insulating layer between the second edge of the second electrode and the display area. The removed portion of the insulation layer may be removed by static electricity discharge induced from the display area prior to forming the second electrode.

In one or more embodiments, a thin film transistor substrate comprises a substrate having a display area for displaying an image, and a non-display area adjacent to the display area; a circuit in the non-display area, the circuit including a first electrode and a second electrode, the first electrode disposed between the second electrode and the substrate; and a barrier pattern separate from the first electrode and disposed between a gate connection pattern connected to the display area and the first electrode, the barrier pattern formed on a same layer as the first electrode and the gate connection pattern, the barrier pattern electrically coupled to the second electrode and the gate connection pattern.

In one or more embodiments, the thin film transistor substrate further includes a bridge pattern coupled to the second electrode, the gate connection pattern, and the barrier pattern. The bridge pattern may be formed on a same layer as the second electrode and may overlap with the barrier pattern.

In one or more embodiments, the thin film transistor substrate further includes an insulation layer between the first electrode and the second electrode, where the bridge pattern is coupled to the barrier pattern. The bridge pattern may be coupled to the barrier pattern through a removed portion of the insulation layer between the first electrode and the display area. The removed portion of the insulation layer may be removed by static electricity discharge induced from the display area prior to forming the bridge pattern.

In one or more embodiments, the barrier pattern includes an identification pattern for identifying a part of the circuit or another circuit included in the display area.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Figure 1:
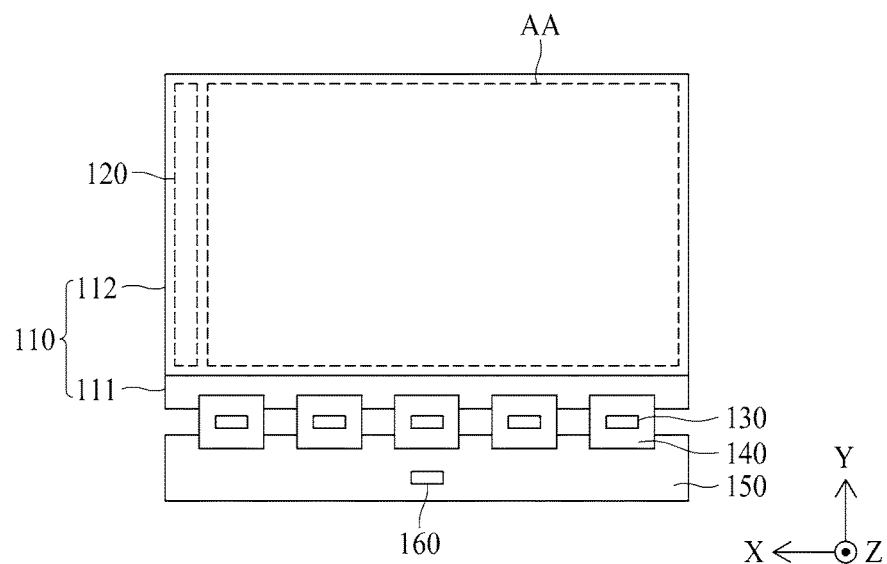
FIG. 1 is a block diagram illustrating a display device according to one embodiment.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "first horizontal axis direction", "second horizontal axis direction", and "vertical axis direction" are not limited to a perpendicular geometric configuration. That is, "first horizontal axis direction", "second horizontal axis direction", and "vertical axis direction" may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a thin film transistor substrate according to embodiments of the present invention and a display device including the same will be described in detail with reference to the accompanying drawings.

FIG. 1 is a block diagram illustrating a display device according to one embodiment. For convenience of explanation in FIG. 1, "first horizontal axis direction (X)" is parallel to a gate line, "second horizontal axis direction (Y)" is parallel to a data line, and "vertical axis direction (Z)" is a thickness (or height) direction of the display device. The display device according to one embodiment may include a display panel 110, a circuit part 120, and a panel driver.

The display device according to one embodiment may be applied to a liquid crystal display device, an electrophoresis display, an organic light emitting display device, and etc. Hereinafter, the display device applied to the liquid crystal display device according to one embodiment will be described in detail as follows.

In case of the display device applied to the liquid crystal display device according to one embodiment, the display panel 110 may include a thin film transistor substrate 111, an opposite substrate 112, and a liquid crystal layer interposed between the thin film transistor substrate 111 and the opposite substrate 112.

The thin film transistor substrate 111 may include a plurality of gate lines and a plurality of data lines, wherein the gate and data lines cross each other.

The plurality of gate lines are extending along the first horizontal axis (X) direction of the thin film transistor substrate 111, and are provided at fixed intervals along the second horizontal axis (Y) direction being in perpendicular to the first horizontal axis (X) direction.

The plurality of data lines may be disposed perpendicular to the plurality of gate lines. The plurality of data lines may extend along a second horizontal axis (Y) direction, and are provided at fixed intervals along a first horizontal axis (X) direction.

The pixels are respectively provided at the intersections of the gate and data lines. Each of the pixels may include a thin film transistor, a pixel electrode, a common electrode, a liquid crystal layer, and a storage capacitor. The thin film transistor is turned-on by a gate signal of the gate line, and the turned-on thin film transistor supplies a data voltage of the data line to the pixel electrode. The common electrode is connected with a common line, and a common voltage is supplied from the common line to the common electrode.

Each of the pixels drives liquid crystal of the liquid crystal layer by an electric field generated in accordance with a potential difference between the data voltage supplied to the pixel electrode and the common voltage supplied to the common electrode. An alignment of the liquid crystal is changed according to whether or not the electric field is generated, and in accordance with an intensity of the electric field so that it is possible to adjust a transmission amount of light emitted from a backlight unit. As a result, an image with a grayscale based on the data voltage is displayed on the pixels. The storage capacitor is disposed between the pixel electrode and the common electrode. The storage capacitor maintains a constant potential difference between the pixel electrode and the common electrode.

In case of a vertical electric field driving mode such as TN (Twisted Nematic) mode or VA (Vertical Alignment) mode, the common electrode is disposed on the opposite substrate 112. In case of a horizontal electric field driving mode such as IPS (In Plane Switching) mode or FFS (Fringe Field Switching) mode, the common electrode together with the pixel electrode is disposed on the thin film transistor substrate 111. The liquid crystal mode of the display panel 110 may be any other modes as well as the aforementioned TN mode, VA mode, IPS mode, and FFS mode.

The thin film transistor substrate 111 may include a display area (AA) and a non-display area. In the display area (AA), there are gate and data lines crossing each other. Each pixel is defined by the intersection area of the gate and data lines.

The non-display area is disposed adjacent to the display area (AA). In one aspect, the non-display area refers to the remaining area of the thin film transistor substrate 111 except the display area (AA). For example, the non-display area may be the lower, upper, left and right margins of the thin film transistor substrate 111 adjacent to the display area (AA). The opposite substrate 112 may include a black matrix and color filters. The color filters may be disposed in an opening which is not covered by the black matrix. If the display panel 110 has a COT (Color filter On TFT) structure, the black matrix and color filters may be disposed on the thin film transistor substrate 111.

A polarizing plate may be attached to each of the thin film transistor substrate 111 and the opposite substrate 112, and an alignment film for setting a pretilt angle of the liquid crystal may be implemented. Also, a space for maintaining a cell gap of the liquid crystal layer may be implemented between the thin film transistor substrate 111 and the opposite substrate 112.

If the display device according to one embodiment is the organic light emitting display device, the opposite substrate 112 facing the thin film transistor substrate 111 and bonded to the thin film transistor substrate 111 serves as an encapsulation substrate which prevents a permeation of external oxygen or foreign matters.

The circuit part 120 generates the gate signal in accordance with a gate control signal which is input from the panel driver, and supplies the generated gate signal to the gate line. The circuit part 120 according to one embodiment is prepared as a GIP (Gate in Panel) circuit in the non-display area of the thin film transistor substrate 111.

The GIP circuit together with the thin film transistor of the pixel may be provided in the non-display area of the thin film transistor substrate 111. For example, the circuit part 120 of the GIP circuit may be provided in the non-display area at one side and/or the other side of the display area (AA). The circuit part 120 may be implemented in a predetermined portion of the non-display area capable of supplying the gate signal to the gate line.

The panel driver may include a plurality of source drive integrated circuits (hereinafter, referred to as source drive ICs) 130, a plurality of flexible circuit films 140, a circuit board 150, and a timing controller 160.

Each of the plurality of source drive ICs 130 may be mounted on a corresponding flexible circuit film 140. Each of the plurality of source drive ICs 130 receives a data control signal and digital video data from the timing controller 160, converts the digital video data into an analog data voltage in accordance with the data control signal, and supplies the analog data voltage to the data lines. If the source drive IC 130 is manufactured in driving chips, each of the source drive ICs 130 may be mounted on the flexible circuit film 140 by a COF (Chip on Film) or COP (Chip on Plastic) method.

Each of the plurality of flexible circuit films 140 is attached to a pad portion in the thin film transistor substrate 111. In this case, each of the plurality of flexible circuit films 140 is attached to the pad by the use of ACF (Anisotropic Conducting Film). Each of the plurality of flexible circuit films 140 supplies the data voltage, which is supplied from the source drive IC 130, to the data line via the pad portion. Also, at least one of the flexible circuit films 140 supplies the gate control signal, which is supplied from the timing controller 160, to the circuit part 120.

The circuit board 150 is connected with the plurality of flexible circuit films 140. The circuit board 150 supports the plurality of circuits formed of driving chips. For example, the timing controller 160 may be mounded on the circuit board 150. The circuit board 150 may be a printed circuit board or a flexible printed circuit board.

The timing controller 160 is mounted on the circuit board 150. The timing controller 160 receives digital video data and timing synchronization signals from an external system board. In this case, the timing synchronization signals may include a vertical synchronization signal for defining 1 frame period, a horizontal synchronization signal for defining 1 horizontal period, a data enable signal for indicating whether or not data is valid, and a dot clock corresponding to a clock signal having a predetermined cycle.

The timing controller 160 generates the gate control signal for controlling an operation timing of the GIP circuit 120 and the data control signal for controlling the source drive ICs 130 on the basis of the timing synchronization signals. The timing controller 160 supplies the gate control signal to the circuit part 120, and supplies the data control signal to the plurality of source drive ICs 130.

Figure 2:
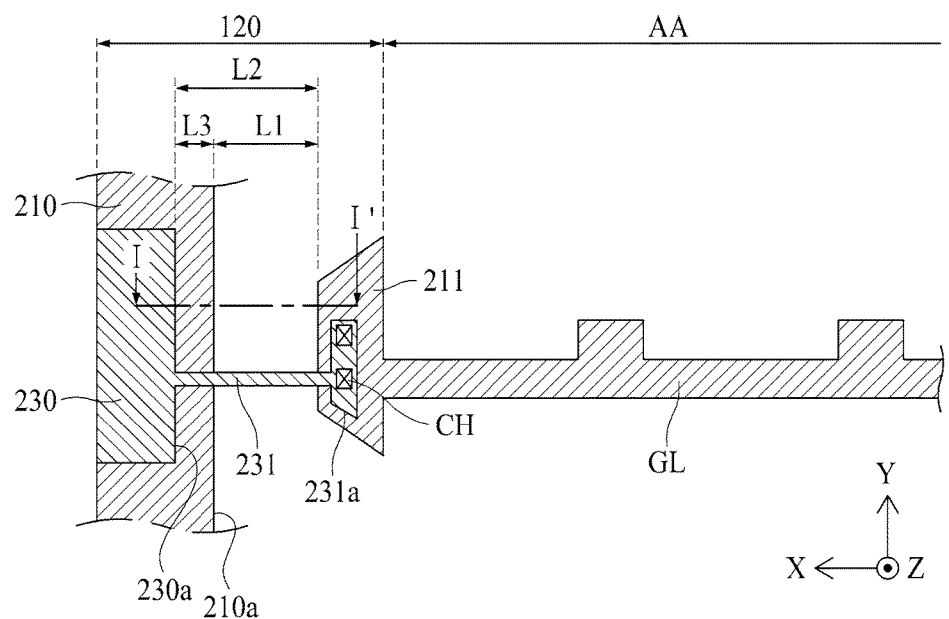
FIG. 2 is a plane view illustrating predetermined portions of a display area and a circuit part in a thin film transistor substrate according to a first embodiment.
Figure 3:
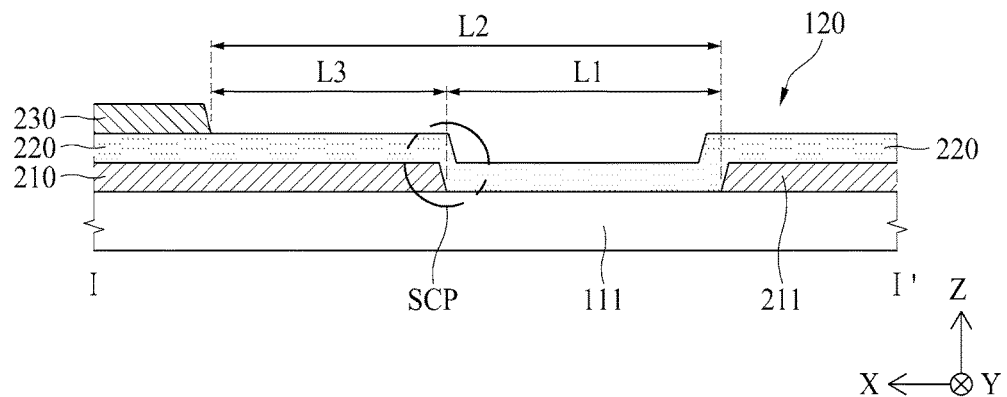
FIG. 3 is a cross sectional view along I-I' of FIG. 2.
Figure 4:
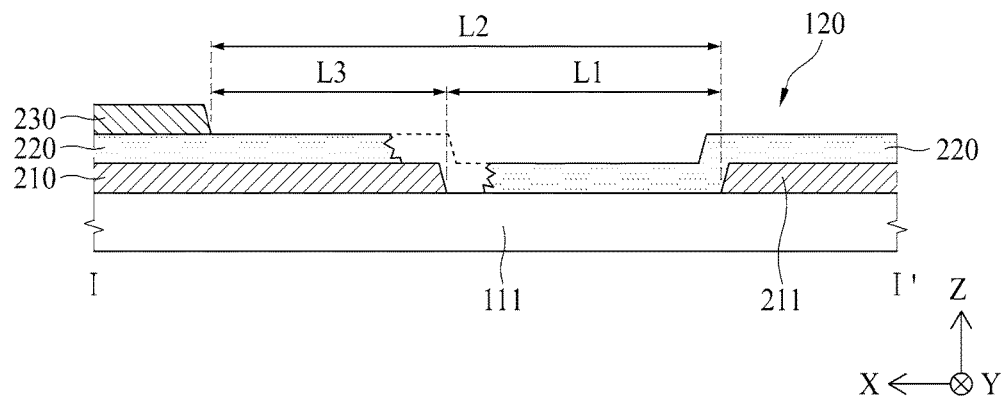
FIG. 4 is a cross sectional view showing a case where an insulating film is damaged and lost by static electricity flowing into a gate connection pattern of FIG. 2.

FIG. 2 is a plan view illustrating predetermined portions of the display area and the circuit part in the thin film transistor substrate according to the first embodiment. FIG. 3 is a cross sectional view along I-I' of FIG. 2. FIG. 4 is a cross sectional view illustrating a gate connection pattern when static electricity is generated. Hereinafter, improvements of the circuit part 120 according to one embodiment will be described with reference to FIGS. 2 to 4.

The circuit part 120 according to the first embodiment may include a first electrode 210, an insulating film 220, a second electrode 230, and a bridge pattern 231.

The first electrode 210 is disposed in a circuit part area defined on the thin film transistor substrate 111. In more detail, the first electrode 210 is disposed in the area with the circuit part 120 on the thin film transistor substrate 111. The area with the circuit part 120 corresponds to the non-display area, which is provided at a predetermined interval from the display area (AA). The first electrode 210 together with a gate electrode (GE) prepared in the display area (AA) may be implemented in the circuit part area.

A gate connection pattern 211 is spaced apart from the first electrode 210 by a first length (L1). The gate connection pattern 211 may be diverged from or protruding out of an end (also referred to as an "edge") of one side of the gate line (GL) so that the gate connection pattern 211 may have a relatively large area. In this case, the gate connection pattern 211 may protrude from an end of one side of the gate line (GL) so as to have a predetermined area for an electrical connection with the bridge pattern 231. For example, a width in (Y) direction on one side of the gate connection pattern 211 may be different from a width in (Y) direction on the other side of the gate connection pattern 211. Also, the gate connection pattern 211 may have various shapes, for example, rectangular shape, trapezoid shape, circle shape, oval shape, and etc., but not limited to these shapes.

Through a connection between the gate connection pattern 211 and the bridge pattern 231, the circuit part 120 and the gate line (GL) may be connected with each other.

The first length (or interval, L1) between the gate connection pattern 211 and the first electrode 210 may be set in a predetermined range enabling an electrical insulation or a predetermined range capable of being secured for a manufacturing process. If the first length (L1) is too short, static electricity discharged (or emitted) from the gate connection pattern 211 may be transmitted to the first electrode 210. In this case, an insulating film 220 provided on the first electrode 210 may be damaged, and furthermore be lost. Accordingly, the first length (L1) is set in a predetermined range capable of preventing or minimizing the transmission of static electricity from the gate connection pattern 211 to the first electrode 210. The first electrode 210 may be formed of a metal or alloy material with good electrical conductivity.

FIG. 2 shows the trapezoid-shaped gate connection pattern 211, but not limited to this shape. The gate connection pattern 211 may be manufactured in any shape conforming to a manufacturing process. The gate connection pattern 211 and the first electrode 210 are formed in the same layer. The gate connection pattern 211 may be formed of a metal or alloy material with good electrical conductivity. Especially, the gate connection pattern 211 and the first electrode 210 may be formed of the same material. Accordingly, the gate connection pattern 211 and the first electrode 210 may be manufactured at the same time, whereby there is no additional process or mask for forming the gate connection pattern 211. Thus, it is possible to minimize a manufacturing cost of the gate connection pattern 211.

The insulating film 220 is prepared on the thin film transistor substrate 111, wherein the insulating film 220 covers the first electrode 210, the gate connection pattern 211, and the gate line (GL) formed in the same layer. Accordingly, the insulating film 220 is a gate insulating film having a single-layered structure or multi-layered structure of an inorganic material. For example, the insulating film 220 may be formed of silicon oxide (SiOx) or silicon nitride (SiNx).

The second electrode 230 is disposed on the insulating film 220 and overlaps with the first electrode 210. In this case, the second electrode 230 is spaced apart from the gate connection pattern 211 by a second length (L2). A semiconductor layer is interposed between the first electrode 210 and the second electrode 230. Accordingly, the first and second electrodes 210 and 230 overlaps with each other, and the semiconductor layer interposed between the first and second electrodes 210 and 230 constitute the transistor.

Herein, one end 210a of the first electrode 210 according to one embodiment extends greater than one end 230a of the second electrode 230. In more detail, one end 210a of the first electrode 210 extends toward the display area (AA), wherein an extending length of the first electrode 210 between one end 230a of the second electrode 230 and one end 210a of the first electrode 210 corresponds to a third length (L3). Accordingly, one end 210a of the first electrode 210 is positioned between one end 230a of the second electrode 230 and the display area (AA). Accordingly, a step coverage portion (SCP) of the insulating film 220 for covering one end 210a of the first electrode 210 is spaced apart from one end 230a of the second electrode 230 by about the third length (L3), whereby one end 230a of the second electrode 230 is overlapped with a flat portion of the insulating film 220 which is maintained at a constant thickness instead of the step coverage portion (SCP) of the insulating film 220. In this case, the step coverage portion (SCP) of the insulating film 220 may be defined as a portion for covering one end 210a of the first electrode 210 and the substrate, or an area of the insulating film 220 covering the thickness of the first electrode 210.

As shown in FIG. 4, if static electricity flowing into the gate connection pattern 211 is discharged to the first electrode 210 of the circuit part 120, the static electricity may be transmitted to the first electrode 210. However, even though the static electricity is transmitted to the first electrode 210, the insulating film 220 overlapped with the second electrode 230 is maintained at the preset thickness for the electrical insulation between the first electrode 210 and the second electrode 230, whereby the insulating film 220 overlapped with the second electrode 230 is not damaged by the static electricity. The static electricity flowing into the gate connection pattern 211 is discharged to one end 210a of the first electrode 210 which is adjacent to the step coverage portion (SCP) of the insulating film 220 having the relatively small thickness, whereby the step coverage portion (SCP) of the insulating film 220 is damaged and lost. The step coverage portion (SCP) of the insulating film 220, which is sufficiently spaced apart from the second electrode 230, is damaged and lost by the static electricity. Thus, even though some of the first electrode 210 is exposed, the second electrode 230 provided on the insulating film 220 is not formed in the lost area of the insulating film 220. During the process of forming the second electrode 230 after the process of forming the insulating film 220, it is possible to prevent the second electrode 230 from being electrically connected with the first electrode 210 via the lost area of the insulating film 220, thereby preventing defects.

Selectively, in case of the first embodiment, in comparison to the second electrode 230, the first electrode 210 extends toward the display area (AA) by the third length (L3), but not limited to this structure. Alternatively, one end 230a of the second electrode 230 may be removed by the third length (L3), or one end 230a of the second electrode 230 may be shifted or shortened in an opposite direction to the display area (AA). Hence, one end 210a of the first electrode 210 is not overlapped with one end 230a of the second electrode 230 so that it is possible to prevent a short connection between the first electrode 210 and the second electrode 230.

Additionally, with reference to the third length (L3) between one end 210a of the first electrode 210 and one end 230a of the second electrode 230, the lost area of the insulating film 220, which is generated at one end 210a of the first electrode 210, may be changed based on the intensity of static electricity. For this reason, the third length (L3) is set to be larger than a length (or width) in the lost area of the insulating film 220 which is generated under the maximum intensity of static electricity.

According to experimental results, the length of the insulating film 220 provided on the first electrode 210 damaged by the general static electricity is 1.5 μm or more than 1.5 μm (L4). Also, an error range of overlay between the first electrode 210 and the second electrode 230 is about 1.5 μm. As a result, the third length (L3) should be 3 μm or more than 3 μm.

If the first electrode 210 unnecessarily extends toward the display area (AA), a bezel width is increased so that a manufacturing cost of the first electrode 210 is increased. Meanwhile, if the second electrode 230 is unnecessarily shortened in the opposite direction to the display area (AA), the area of the second electrode 230 is reduced, thereby deteriorating the transistor properties and reliability due to the reduced second electrode 230. Accordingly, the third length (L3) is set to be 5 μm, preferably.

As the aforementioned first electrode 210 together with the gate line is provided in the area of the circuit part, the first electrode 210 may be the gate electrode of the transistor. As the second electrode 230 together with the data line is provided on the insulating film 220 while being overlapped with the first electrode 210, the second electrode 230 may be the source/drain electrode of the transistor.

The bridge pattern 231 electrically connects the second electrode 230 and the gate connection pattern 211, which are provided at the different areas in the different layers, in accordance with the line jumping structure. The bridge pattern 231 according to one embodiment having a narrow width extends from one end 230a of the second electrode 230 to the gate connection pattern 211, wherein the bridge pattern 231 together with the second electrode 230 is provided on the insulating film 220.

An extending one end 231a of the bridge pattern 231 is electrically connected with the gate connection pattern 211 via a contact hole (CH) prepared in the insulating film 220, wherein the contact hole (CH) is provided to expose some of the gate connection pattern 211. In this case, some of the bridge pattern 231, which extends from one end 230a of the second electrode 230 toward the display area (AA), is overlapped with some of the extending portion of the first electrode 210.

In the thin film transistor substrate according to the first embodiment, even though some of the insulating film 220 provided on the first electrode 210 is damaged by the static electricity from the gate connection pattern 211, one end 210a of the first electrode and one end 230a of the second electrode 230 are not overlapped with each other in the damaged area of the insulating film 220 so that it is possible to minimize a short connection between the first electrode 210 and the second electrode 230.

Figure 5:
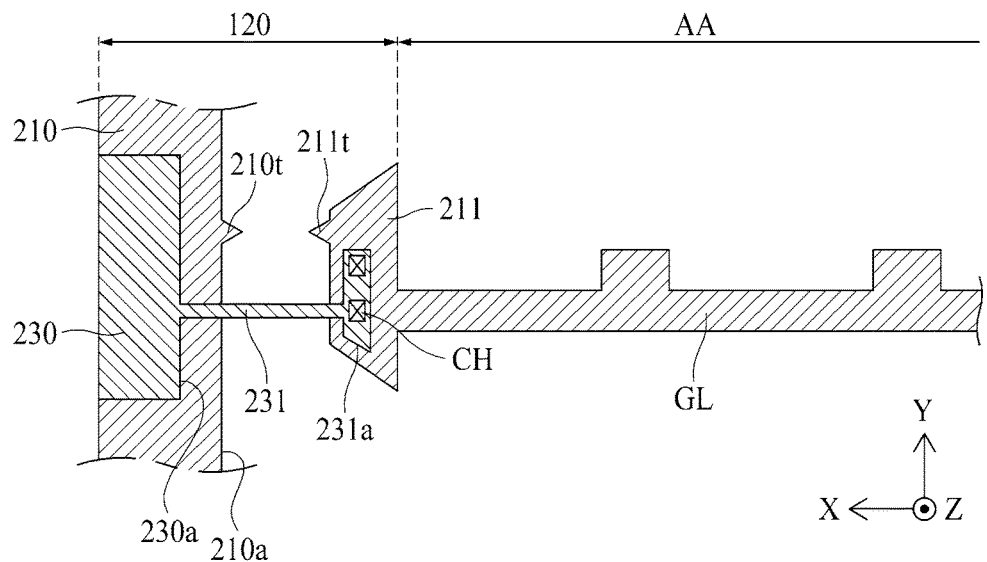
FIG. 5 is a plan view illustrating predetermined portions of a display area and a circuit part in a thin film transistor substrate according to a second embodiment.

FIG. 5 is a plan view illustrating predetermined portions of the display area and the circuit part in the thin film transistor substrate according to the second embodiment. Except an additionally-provided static induction pattern, the thin film transistor substrate according to the second embodiment shown in FIG. 5 is identical in structure to the thin film transistor substrate according to the first embodiment shown in FIG. 2. Hereinafter, only the static induction pattern and its related structures will be described in detail as follows, and a detailed description for the remaining structures except the static induction pattern will be omitted.

The static induction pattern according to the embodiment is provided at least one of the gate connection pattern 211 and the first electrode 210.

The static induction pattern according to one embodiment may include a first protruding tip 211t protruding from one side of the gate connection pattern 211 adjacent to the first electrode 210 toward the first electrode 210.

The first protruding tip 211t according to one embodiment may protrude from one side of the gate connection pattern 211 towards the first electrode 210. For example, the first protruding tip 211t according to one embodiment may have a lightning rod structure. In this case, the first protruding tip 211t protrudes from one portion of an upper side of the gate connection pattern 211 which is spaced to the maximum from the bridge pattern 231, whereby the first protruding tip 211t is prepared in the circuit part area where the first electrode 210, the second electrode 230, and the bridge pattern 231 are not provided. In comparison to one side of the gate connection pattern 211, the first protruding tip 211t is positioned relatively closer to the first electrode 210 so that the first protruding tip 211t discharges the static electricity flowing in the gate connection pattern 211 toward the first electrode 210. In one aspect, the first protruding tip 211t is disposed away from the bridge pattern 231 so that it is possible to prevent the static electricity from flowing into the first electrode 210 overlapped with the bridge pattern 231. That is, the static electricity flowing into the gate connection pattern 211 is concentrated on the first protruding tip 211t which is formed in the sharp shape (i.e., pointing shape) and is positioned closer to the first electrode 210 than a side of the gate connection pattern facing the first electrode 210. In addition, the static electricity concentrated on the first protruding tip 211t is discharged from the first protruding tip 211t to the first electrode 210 so that it is possible to prevent the insulating film 220 from being damaged and lost by the static electricity generated in the overlap portion between the first electrode 210 and the bridge pattern 231.

Another static induction pattern according to another embodiment may include a second protruding tip 210t protruding from one end 210a of the first electrode 210 which is adjacent to one side of the gate connection pattern 211 toward one side of the gate connection pattern 211.

The second protruding tip 210t according to one embodiment may protrude from one end 210a of the first electrode 210 toward one side of the gate connection pattern 211. For example, the second protruding tip 210t according to one embodiment may have a lightning rod structure. In this case, the second protruding tip 210t protrudes from one portion of an upper side of the first electrode 210 which is disposed away from the bridge pattern 231, whereby the second protruding tip 210t is prepared in the circuit part area where the gate connection pattern 211, the second electrode 230, and the bridge pattern 231 are not provided. In comparison to one side of the first electrode 210, the second protruding tip 210t is closer to the gate connection pattern 211 so that the second protruding tip 210t absorbs the static electricity discharged to the gate connection pattern 211. Especially, the second protruding tip 210t is spaced away from the bridge pattern 231 so that it is possible to prevent the static electricity from flowing into the first electrode 210 overlapped with the bridge pattern 231. That is, the static electricity discharged from the gate connection pattern 211 is discharged from one side of the gate connection pattern 211, which is relatively adjacent to the second protruding tip 210t in comparison to the first electrode 210, toward the second protruding tip 210t so that it is possible to prevent the insulating film 220 from being damaged and lost by the static electricity generated in the overlap portion between the first electrode 210 and the bridge pattern 231.

Another static induction pattern according to another embodiment may include both the first protruding tip 211t and the second protruding tip 210t. That is, the static induction pattern according to another embodiment may include at least one of the first protruding tip 211t prepared at one side of the gate connection pattern 211 and the second protruding tip 210t prepared at one side of the first electrode 210. In this case, in order to minimize the damaged and lost area of the insulating film 220 by the static electricity discharged from the first protruding tip 211t and concentrated on the second protruding tip 210t, an end of the second protruding tip 210t for absorbing the static electricity may have a linear or curved line shape which is different from that of the first protruding tip 211t, but not limited to this structure. An end of the second protruding tip 210t may have various shapes capable of absorbing the static electricity discharged from the first protruding tip 211t.

Accordingly, the thin film transistor substrate according to the second embodiment further includes the lightning rod structure in accordance with the static induction pattern so that it is possible to prevent a short connection between the first electrode 210 and the second electrode 230.

Figure 6:
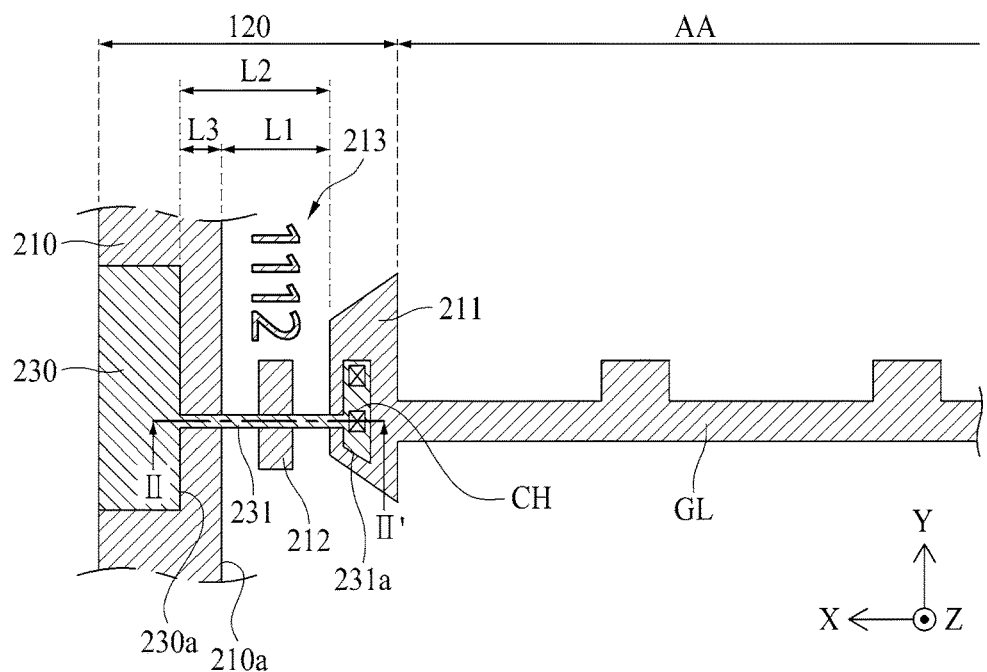
FIG. 6 is a plan view illustrating predetermined portions of a display area and a circuit part in a thin film transistor substrate according to a third embodiment.
Figure 7:
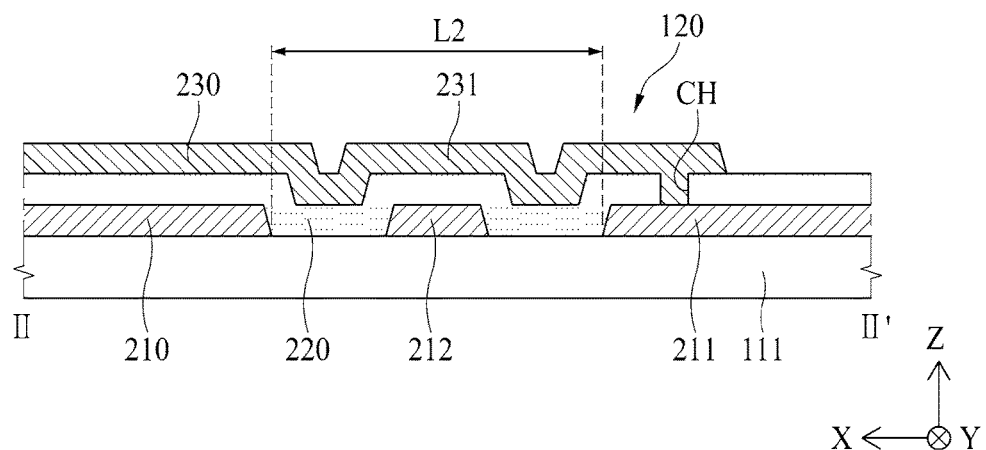
FIG. 7 is a cross sectional view along II-II' of FIG. 6.
Figure 8:
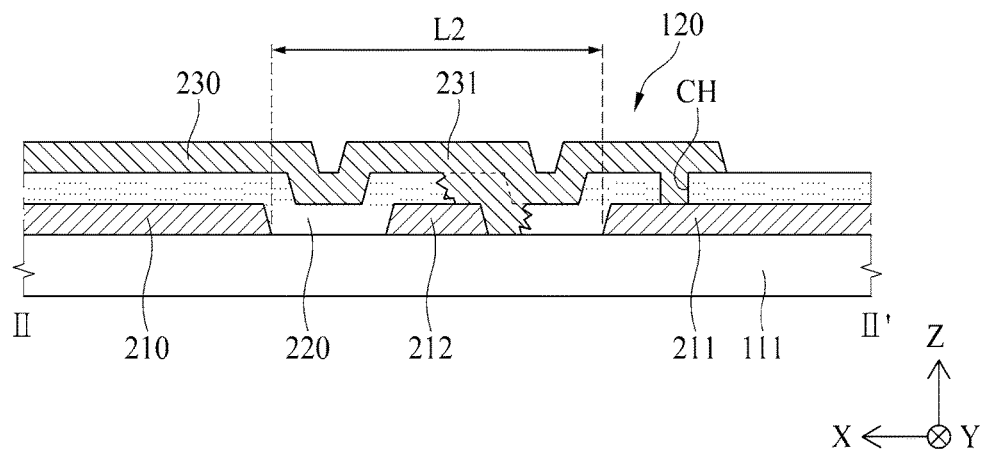
FIG. 8 is a cross sectional view showing a case where an insulating film is damaged and lost by static electricity flowing into a gate connection pattern of FIG. 7.

FIG. 6 is a plan view illustrating predetermined portions of the display area and the circuit part in the thin film transistor substrate according to the third embodiment. FIG. 7 is a cross sectional view along II-II' of FIG. 6. FIG. 8 is a cross sectional view showing a case where the insulating film is damaged and lost by the static electricity flowing into the gate connection pattern. Except an additionally-provided barrier pattern, the thin film transistor substrate according to the third embodiment shown in FIG. 6 is identical in structure to the thin film transistor substrate according to the first embodiment shown in FIG. 2. Hereinafter, the barrier pattern and its related structures will be described in detail as follows, and a detailed description for the remaining structures except the barrier pattern will be omitted.

The barrier pattern 212 according to one embodiment is disposed between the first electrode 210 and the gate connection pattern 211. In more detail, the barrier pattern 212 is disposed between the first electrode 210 and the gate connection pattern 211 while being overlapped with the bridge pattern 231 with respect to the first horizontal axis (X) direction.

The barrier pattern 212 according to one embodiment is provided in the same layer as that of each of the first electrode 210 and the gate connection pattern 211. That is, the barrier pattern 212 together with the first electrode 210 and the gate connection pattern 211 may be disposed on the substrate 111, and the barrier pattern 212 may be formed of the same metal material as that of each of the first electrode 210 and the gate connection pattern 211. Accordingly, the barrier pattern 212 may be obtained by adding the barrier pattern 212 in a mask for forming the first electrode 210 and the gate connection pattern 211.

The barrier pattern 212 according to one embodiment may have an island shape which is provided at a predetermined interval from each of the first electrode 210 and the gate connection pattern 211 and is electrically separated from the first electrode 210 and the gate connection pattern 211. For example, the barrier pattern 212 may be prepared in the middle area between the first electrode 210 and the gate connection pattern 211 along the first horizontal axis (X) direction. In FIG. 6, a width of the barrier pattern 212 along the second horizontal axis (Y) direction is relatively larger than a width of the bridge pattern 231 along the second horizontal axis (Y) direction, but is not limited to this structure. For example, a width of the barrier pattern 212 may be the same as or smaller than a width of the bridge pattern 231.

The barrier pattern 212 according to one embodiment may be electrically floating. Accordingly, the barrier pattern 212 is not connected with both the first electrode 210 and the gate connection pattern 211, and is maintained in the electrically floating state, whereby the barrier pattern 212 does not function as a signal transmission line or electrode.

The barrier pattern 212 prevents a short connection between the first electrode 210 and the second electrode 230 by the damaged and lost area of the insulating film 220 in accordance with the static electricity flowing into the gate connection pattern 211. In more detail, if the static electricity flowing into the gate connection pattern 211 is discharged to the first electrode 210, as shown in FIG. 8, some of the insulating film 220, which is formed at an end of the barrier pattern 212 closer to the gate connection pattern 211 than the first electrode 210, is damaged and lost by the static electricity, thereby preventing the insulating film 220 provided at an end of the first electrode 210 from being damaged and lost. During the process of forming the second electrode 230 after the process of forming the insulating film 220, the bridge pattern 231 provided on the insulating film 220 is brought into contact with the barrier pattern 212 via the lost area of the insulating film 220. Accordingly, the bridge pattern 231 is electrically connected with the island-shaped barrier pattern 212 instead of the first electrode 210, forcibly, so that it is possible to prevent a short connection between the bridge pattern 231 and the first electrode 210. Also, the barrier pattern 212 having the area overlapped with the bridge pattern 231 was electrical floating (or electrically isolated from the first electrode 210) before being connected to the bridge pattern 231, so that even after the bridge pattern 231 is connected to the barrier pattern 212a signal applied to the bridge pattern 231 is not affected.

Additionally, the thin film transistor substrate according to the third embodiment further includes an identification pattern 213.

The identification pattern 213 serves as an identifier for designating, directing or explaining a predetermined portion or part of the circuit part 120 or any circuit included in the display area (AA). The identification pattern 213 is prepared in an island shape between the first electrode 210 and the gate connection pattern 211. The identification pattern 213 according to one embodiment shows a serial number of the circuit, wherein the identification pattern 213 according to one embodiment may include at least one among a number, a letter, and a mark.

The identification pattern 213 according to one embodiment may be provided in the same layer as those of the first electrode 210, the gate connection pattern 211, and the barrier pattern 212. That is, the identification pattern 213 together with the first electrode 210, the gate connection pattern 211 and the barrier pattern 212 may be prepared on the substrate 111, and the identification pattern 213 may be formed of the same metal material as that of each of the first electrode 210, the gate connection pattern 211 and the barrier pattern 212. Accordingly, the identification pattern 213 may be obtained by adding the identification pattern 213 in a mask for forming the first electrode 210, the gate connection pattern 211 and the barrier pattern 212, whereby there is no need for an additional mask for the identification pattern 213.

In some embodiments, the identification pattern 213 may be used to show a serial number of the substrate as well as the serial number of the circuit.

As described above, the thin film transistor substrate according to the third embodiment may provide the same effect as that of the thin film transistor substrate according to the first embodiment. If the static electricity is transmitted to the circuit part 120 in the overlap area with the bridge pattern 231, it is possible to prevent a short connection between the first electrode 210 and the second electrode 230 or a short connection between the first electrode 210 and the bridge pattern 231 by the use of barrier pattern 212.

Additionally, the thin film transistor substrate according to the third embodiment may further include the static induction pattern (e.g., 210t, 211t) shown in FIG. 5. In this case, the static induction pattern prevents a short connection between the first electrode 210 and the second electrode 230 or a short connection between the first electrode 210 and the bridge pattern 231.

Figure 9:
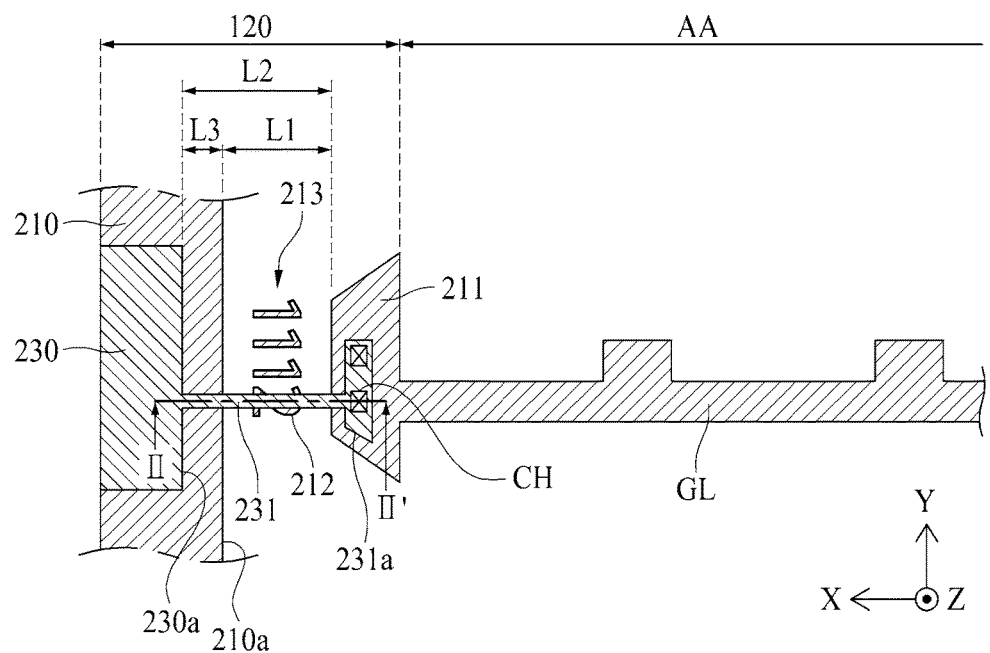
FIG. 9 is a plane view illustrating predetermined portions of a display area and a circuit part in a thin film transistor substrate according to a fourth embodiment.

FIG. 9 is a plan view illustrating predetermined portions of the display area and the circuit part in the thin film transistor substrate according to the fourth embodiment, which is obtained by changing a structure in the barrier pattern of the thin film transistor substrate according to the third embodiment shown in FIG. 6. Hereinafter, only the barrier pattern and its related structures will be described in detail as follows, and a detailed description for the remaining structures except the barrier pattern will be omitted.

The barrier pattern 212 according to another embodiment may be formed of the identification pattern 213. To this end, the identification pattern 213 is disposed between the first electrode 210 and the gate connection pattern 211 while being overlapped with the bridge pattern 231 along the first horizontal axis (X) direction of the thin film transistor substrate according to the fourth embodiment. That is, the identification pattern 213 is disposed between the first electrode 210 and the gate connection pattern 211, and is shifted along the second horizontal axis (Y) direction to overlap with the bridge pattern 231. Accordingly, some of the identification pattern 213 is disposed between the first electrode 210 and the gate connection pattern 211 while being overlapped with the bridge pattern 231, whereby some of the identification pattern 213 serves as the barrier pattern 212. For example, if the identification pattern 213 is a four-digit number, any one of the four-digits is disposed between the first electrode 210 and the gate connection pattern 211 while being overlapped with the bridge pattern 231, whereby the identification pattern 213 serves as the barrier pattern 212.

Accordingly, in the thin film transistor substrate according to the fourth embodiment, the barrier pattern 212 is formed of some part of the shifted identification pattern 213, that is, the barrier pattern 212 has a type of a number, a letter, or a mark.

In the thin film transistor substrate according to the fourth embodiment, it is possible to prevent a short connection between the first electrode 210 and the second electrode 230 or a short connection between the first electrode 210 and the bridge pattern 231 in the area overlapped with the bridge pattern 212 through the use of barrier pattern 212 formed of some part of the identification pattern 213.

Additionally, the thin film transistor substrate according to the fourth embodiment may further include the static induction pattern shown in FIG. 5. In this case, it facilitates the prevention of short connection between the first electrode 210 and the second electrode 230 or between the first electrode 210 and the bridge pattern 231.

Figure 10:
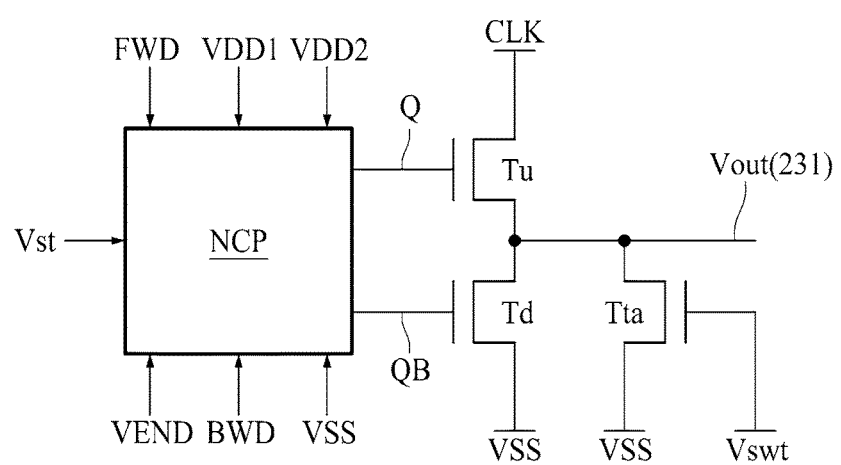
FIG. 10 is a circuit diagram illustrating a circuit part connected with a gate connection pattern of the thin film transistor substrate according to one or more embodiments.
Figure 11:
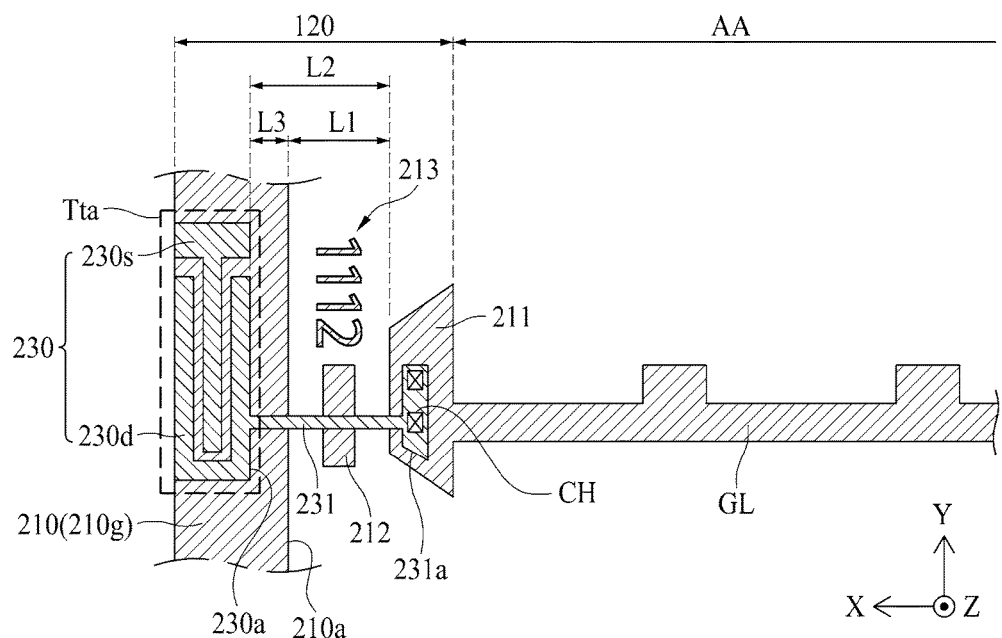
FIG. 11 is a plan view illustrating a transistor connected with the gate connection pattern shown in FIG. 10.

FIG. 10 is a circuit diagram illustrating the circuit part connected with the gate connection pattern of the thin film transistor substrate according to one or more embodiments. FIG. 11 is a plan view illustrating the transistor connected with the gate connection pattern shown in FIG. 10.

Referring to FIGS. 10 and 11, the circuit part 120 connected with the gate connection pattern of the thin film transistor substrate according to one or more embodiments may be a shift register having a plurality of stages for supplying a gate high voltage or a gate low voltage (or base voltage) to the gate line (GL) connected with the gate connection pattern 211. In this case, FIG. 10 shows any one stage among the plurality of stages.

Each of the plurality of stages according to one embodiment may include a node controller (NCP), a pull-up transistor (Tu), a pull-down transistor (Td), and a tail transistor (Tta).

The node controller (NCP) controls a voltage of a first node (Q) and a voltage of a second node (QB) in response to an input start signal (Vst). In more detail, the node controller (NCP) receives the start signal (Vst), a forward direction signal (FWD), a reverse direction signal (BWD), a frame end signal (VEND), a first driving voltage (VDD1), and a second driving voltage (VDD2), for example, from the timing controller 160. The node controller (NCP) supplies the forward direction signal (FWD) to the first node (Q) in response to the start signal (Vst), and simultaneously supplies the base voltage (VSS) to the second node (QB) in response to a voltage of the first node (Q). Also, the node controller (NCP) supplies the first driving voltage (VDD1) to the second node (QB), and simultaneously supplies the base voltage (VSS) to the first node (Q) in response to a voltage of the second node (QB). Further, in order to reset the first node (Q) and the second node (QB), the node controller (NCP) supplies the reverse direction signal (BWD) to the first node (Q) in response to the frame end signal (VEND), and simultaneously supplies the base voltage (VSS) to the second node (QB) in response to the second driving voltage (VDD2).

The pull-up transistor (Tu) outputs a clock signal (CLK) having a gate high voltage level to an output terminal Vout in accordance with the voltage of the first node (Q). The output terminal Vout is coupled to the bridge pattern 231. In this case, the clock signal (CLK) is supplied to the gate connection pattern 211 via the output terminal and the bridge pattern 231, to thereby turn-on the thin film transistor of the pixel connected with the gate line (GL). The pull-up transistor (Tu) according to one embodiment may include a gate electrode connected with the first node (Q), a source electrode connected with a clock signal line, and a drain electrode connected with the output terminal (Vout). In this case, the source electrode and the drain electrode included in the pull-up transistor (Tu) may be changed in their positions in accordance with a current direction.

The pull-down transistor (Td) outputs the base voltage (VSS) having a high off voltage level to the output terminal (Vout) in accordance with the voltage of the second node (QB). In this case, the base voltage (VSS) is supplied to the gate connection pattern 211 via the output terminal (Vout) and the bridge pattern 231, to thereby turn-off the thin film transistor of the pixel connected with the gate line (GL). The pull-down transistor (Td) according to one embodiment may include a gate electrode connected with the second node (QB), a source electrode connected with the output terminal (Vout), and a drain electrode connected with a base voltage line. In this case, the source electrode and the drain electrode included in the pull-down transistor (Tu) may be changed in their positions in accordance with a current direction.

The tail transistor (Tta) supplies the base voltage (VSS) to the output terminal (Vout) in response to a switching signal (Vswt). In this case, the base voltage (VSS) is supplied to the gate connection pattern 211 via the output terminal (Vout) and the bridge pattern 231 so that it is possible to prevent the gate line (GL) from being electrically floating. The tail transistor (Tta) according to one embodiment may include a gate electrode 210g for receiving the switching signal (Vswt), a source electrode 230s connected with the base voltage line (VSS), and a drain electrode 230d connected with the output terminal (Vout). In this case, the source electrode 230s and the drain electrode 230d included in the tail transistor (Tta) may be changed in their positions in accordance with a current direction.

The gate electrode 210g of the tail transistor (Tta) may correspond to the first electrode 210 shown in FIGS. 1 to 9, and the drain electrode 230d of the tail transistor (Tta) may correspond to the second electrode 230 shown in FIGS. 1 to 9.

Additionally, if the display device in one or more embodiments includes a display area (AA) having a touch electrode of an in-cell touch structure, the tail transistor (Tta) prevents the gate line (GL) from being floated in the gate low voltage when a touch period is started after a display period in the display device. To this end, the switching signal (Vswt) has the gate high voltage level for turning-on the tail transistor (Tta) during a period between the display period and the touch period of the display device. The display area (AA) having the touch electrode of the in-cell touch structure may include the touch electrode of the in-cell touch structure disclosed in the U.S. Pat. No. 9,024,913 and US Patent Application Publication No. 2016/0019827, which are included herein by reference. A detailed description for the touch electrode of the in-cell touch structure will be omitted.

The tail transistor (Tta) is provided adjacent to the gate connection pattern 211. Thus, if the gate electrode 210g of the tail transistor (Tta) does not extend towards the gate connection pattern 211 after the second electrode 230, and if the insulating film 220 for covering one end of the first electrode 210 is damaged and lost by the static electricity discharged from the gate connection pattern 211, the gate electrode 210g of the tail transistor (Tta) may be electrically shorted to the output terminal (Vout) through the lost area of the insulating film 220, thereby causing a malfunction of the circuit part 120. However, the gate electrode 210g of the tail transistor (Tta) according to one or more embodiments disclosed herein extends toward the gate connection pattern 211 more than the drain electrode 230d, and the static induction pattern may be additionally provided. Thus, even though some of the insulating film 220 is damaged and lost by the static electricity, so that it is possible to prevent a short connection (S) between the drain electrode 210d (or output terminal Vout) and the gate electrode 210g of the tail transistor (Tta), thereby preventing a malfunction of the circuit part 120 caused by the static electricity.

Meanwhile, in FIGS. 10 and 11, it is possible to prevent a short connection (S) between the drain electrode 210d and the gate electrode 210g of the tail transistor (Tta), but not limited to this type. In case of the circuit part 120 which is not provided with the tail transistor (Tta), the pull-up transistor (Tu) and/or the pull-down transistor (Td) may be disposed adjacent to the gate connection pattern 211. In the same manner as the aforementioned first electrode 210, the gate electrode 210 in each of the pull-up transistor (Tu) and/or the pull-down transistor (Td) may extend toward the gate connection pattern 211 in comparison to the drain electrode. Additionally, the gate electrode 210 in each of the pull-up transistor (Tu) and/or the pull-down transistor (Td) may further include the static induction pattern. Also, the island-shaped barrier pattern 212 or some of the identification pattern 213 may be additionally provided between the gate connection pattern 211 and the gate electrode 210 in each of the pull-up transistor (Tu) and/or the pull-down transistor (Td).

The first electrode 210 shown in FIGS. 1 to 9 is provided to form the circuit part 120. However, the first electrode 210 shown in FIGS. 1 to 9 may be any electrode of the transistor closest to the gate connection pattern 211.

As described above, the thin film transistor substrate and the display device including the same may include the circuit part provided in the non-display area, wherein the circuit part includes the first electrode, the insulating film on the first electrode, and the second electrode on the insulating film, and one end of the first electrode extends farther than one end of the second electrode, so that it is possible to prevent the short connection between the first electrode and the second electrode caused by the lost area of the insulating film, thereby preventing the circuit part, that is, the gate driving circuit from being damaged and/or being malfunctioned by the static electricity.

According to various embodiments disclosed herein, it is possible to prevent the first and second electrodes provided on the non-display area and prepared with the insulating film interposed in-between from being shorted through the insulating film damaged and lost by the static electricity, thereby preventing the circuit part from being damaged by the static electricity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A thin film transistor substrate comprising;
a substrate having a display area for displaying an image, and a non-display area adjacent to the display area; and
a circuit part in the non-display area, the circuit part including a first electrode, an insulating film on the first electrode, and a second electrode on the insulating film, the first electrode and the second electrode partially overlapping with each other,
wherein an edge of the first electrode facing the display area extends beyond an edge of the second electrode facing the display area,
wherein the circuit part includes a transistor,
wherein the first electrode is a gate electrode of the transistor, and
wherein the second electrode is a drain electrode or a source electrode of the transistor.

2. The thin film transistor substrate according to claim 1, wherein the circuit part further includes a bridge pattern coupled to the second electrode, the bridge pattern protruding towards the display area.

3. The thin film transistor substrate according to claim 2, further comprising a gate connection pattern provided with an interval from the first electrode, wherein the gate connection pattern is electrically connected to the bridge pattern.

4. The thin film transistor substrate according to claim 3, wherein the interval between the first electrode and the gate connection pattern is smaller than an interval between the second electrode and the gate connection pattern.

5. The thin film transistor substrate according to claim 3, wherein the gate connection pattern is provided in a same layer as the first electrode.

6. The thin film transistor substrate according to claim 2, wherein the bridge pattern is partially overlapped with an extending portion of the first electrode, the extending portion between the edge of the first electrode and the edge of the second electrode.

7. The thin film transistor substrate according to claim 5, further comprising a static induction pattern disposed on at least one of the edge of the first electrode and an edge of the gate connection pattern facing the first electrode.

8. The thin film transistor substrate according to claim 7, wherein the static induction pattern includes a protruding tip which does not overlap with the bridge pattern, and protrudes from the edge of the gate connection pattern toward the first electrode.

9. The thin film transistor substrate according to claim 3, further comprising a barrier pattern disposed between the first electrode and the gate connection pattern.

10. The thin film transistor substrate according to claim 9, wherein the barrier pattern is overlapped with the bridge pattern.

11. The thin film transistor substrate according to claim 9, wherein the barrier pattern is disposed on a same layer as the first electrode and the gate connection pattern, and is separated from the first electrode and the gate connection pattern.

12. The thin film transistor substrate according to claim 9, wherein the barrier pattern is formed of a metal material.

13. The thin film transistor substrate according to claim 9, wherein the barrier pattern is electrically isolated from the first electrode.

14. The thin film transistor substrate according to claim 9, wherein the barrier pattern includes an identification pattern for identifying a part of the circuit part or a circuit included in the display area.

15. The thin film transistor substrate according to claim 1, wherein the circuit part disposed in the non-display area is a gate driving circuit.

16. The thin film transistor substrate according to claim 3, wherein the display area includes gate lines and data lines crossing each other, and the gate connection pattern is connected to one of the gate lines.

17. The thin film transistor substrate according to claim 1, wherein the edge of the first electrode facing the display area extends further towards the display area than the edge of the second electrode facing the display area by at least a length of an exposed portion of the first electrode not covered by the insulating film between the edge of the second electrode and the display area.

18. The thin film transistor substrate according to claim 1, wherein the edge of the first electrode protrudes further than the edge of the second electrode towards the display area by at least 3 μm.

19. A thin film transistor substrate comprising;
a substrate having a display area for displaying an image, and a non-display area adjacent to the display area;
a circuit in the non-display area, the circuit including a first electrode and a second electrode, the first electrode disposed between the second electrode and the substrate;
a barrier pattern separate from the first electrode and disposed between a gate connection pattern connected to the display area and the first electrode; and
a bridge pattern coupled to the second electrode, the gate connection pattern, the bridge pattern overlapping with the barrier pattern,
wherein the barrier pattern is electrically floating.

20. The thin film transistor substrate of claim 19,
wherein the barrier pattern is formed on a same layer as the first electrode and the gate connection pattern, and
wherein the bridge pattern is formed on a same layer as the second electrode.

21. The thin film transistor substrate according to claim 19, wherein an edge of the first electrode extends beyond an edge of the second electrode towards the display area.

22. The thin film transistor substrate according to claim 19, wherein the barrier pattern includes an identification pattern for identifying a part of the circuit or another circuit included in the display area.

23. A display panel including:
a thin film transistor substrate comprising;
a substrate having a display area for displaying an image, and a non-display area adjacent to the display area, and
a circuit part in the non-display area, the circuit part including a first electrode, an insulating film on the first electrode, and a second electrode on the insulating film, the first electrode and the second electrode partially overlapping with each other, wherein an edge of the first electrode facing the display area extends beyond an edge of the second electrode facing the display area,
an opposite substrate facing the thin film transistor substrate, the opposite substrate protecting the thin film transistor substrate; and
a panel driver electrically connected to the circuit part for displaying the image,
wherein the circuit part includes a transistor,
wherein the first electrode is a gate electrode of the transistor, and
wherein the second electrode is a drain electrode or a source electrode of the transistor.

* * * * *